United States Patent
Rana

(10) Patent No.: US 7,919,983 B1
(45) Date of Patent: Apr. 5, 2011

(54) MULTIPLE OUTPUT LEVEL SHIFTER

(75) Inventor: Vikas Rana, Greater Noida (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 12/643,244

(22) Filed: Dec. 21, 2009

(30) Foreign Application Priority Data

Oct. 29, 2009 (IN) .......................... 2235/DEL/2009

(51) Int. Cl.
*H03K 19/0175* (2006.01)
(52) U.S. Cl. ............................ 326/81; 326/68; 326/80
(58) Field of Classification Search .................... None
See application file for complete search history.

(56) References Cited

U.S. PATENT DOCUMENTS

| | | | |
|---|---|---|---|
| 4,150,308 A | 4/1979 | Adlhoch | |
| 5,113,097 A | 5/1992 | Lee | |
| 6,002,290 A | 12/1999 | Avery et al. | |
| 6,664,809 B1 | 12/2003 | Chiu | |
| 6,788,125 B1 | 9/2004 | Tomsio | |
| 7,053,658 B1 * | 5/2006 | Blankenship et al. | 326/81 |
| 7,145,363 B2 | 12/2006 | Kim | |
| 7,151,391 B2 * | 12/2006 | Chen et al. | 326/68 |
| 2010/0061164 A1 * | 3/2010 | Tandon et al. | 365/189.11 |

* cited by examiner

*Primary Examiner* — Anh Q Tran
(74) *Attorney, Agent, or Firm* — Lisa K. Jorgenson; William J. Kubida

(57) ABSTRACT

A level shifter for integrated circuits includes input stage transistors, reference stage transistors, a cascode stage coupled to the input stage and the reference stage transistors and a pair of comparators. The cascode stage generates a first cascode output and a second cascode output. The input stage transistors selectively conduct a low reference voltage as the first cascode output based on a pair of inputs provided to the input stage transistors. The reference stage transistors selectively conduct a high reference voltage as the second cascode output based on a first comparator output and a second comparator output. The pair of comparators generate the first and the second comparator outputs based on the first and the second cascode outputs.

20 Claims, 9 Drawing Sheets

105

| INPUT | | OUTPUT | |
|---|---|---|---|
| IN | IN-N | OUT | OUTN |
| 0 | 1 | 0 | $V_{HIGH}$ |
| 1 | 0 | $V_{HIGH}$ | 0 |

| INPUT | | OUTPUT | | | |
|---|---|---|---|---|---|
| IN | IN-N | OUT | OUTN | OUTH | OUTHN |
| 0 | 1 | 0 | $V_{MID}$ | $V_{LOW}$ | $V_{HIGH}$ |
| 1 | 0 | $V_{MID}$ | 0 | $V_{HIGH}$ | $V_{LOW}$ |

| INPUT | | OUTPUT | | | |
|---|---|---|---|---|---|
| IN | IN-N | OUT | OUTN | OUTH | OUTHN |
| 0 | 1 | 0 | $V_{HIGH}$ | $(V_{MID} + V_{TP})$ | $V_{HIGH}$ |
| 1 | 0 | $V_{HIGH}$ | 0 | $V_{HIGH}$ | $(V_{MID} + V_{TP})$ |

Fig. 3b 405-2

| INPUT | | OUTPUT | | | |
|---|---|---|---|---|---|
| IN | IN-N | OUT | OUTN | OUTH | OUTHN |
| 0 | 1 | 0 | $V_{HIGH}$ | $V_{MID}$ | $V_{HIGH}$ |
| 1 | 0 | $V_{HIGH}$ | 0 | $V_{HIGH}$ | $V_{MID}$ |

Fig. 4c

MULTIPLE OUTPUT LEVEL SHIFTER

RELATED APPLICATION

The present application claims priority of Indian Patent Application No. 2235/DEL/2009 filed Oct. 29, 2009, which is incorporated herein in its entirety by this reference.

FIELD OF THE INVENTION

The present invention relates to voltage level conversion for integrated circuits and more particularly voltage level shifters having particular utility VLSI technology.

RELEVANT BACKGROUND

With the recent advancements in very-large-scale integration (VLSI) technology, the complexity of various integrated circuits (ICs) has increased. Today, ICs may include numerous functional modules like processor, memory, timers, counters, voltage regulators, etc. The various functional modules may be integrated on a single IC to enable the IC to operate as a standalone system, referred to as a system on chip (SoC). VLSI meets the ever-increasing market demands for higher compactness, lower power consumption, and enhanced performance. As a result, various ICs and SoCs, collectively referred to as chips, find increased application in various electronic devices.

For the operation of a chip in an electronic device, it is indispensable that the various functional modules present in the chip communicate with each other. However, different functional modules operate at different voltages and generate signals that have different voltage levels. Thus, implementation of a communication interface between the various functional modules operating at different voltages requires conversion of the voltage levels to ensure that the signals are compatible with each other. This voltage level conversion is accomplished by a level shifter. Various implementations for level shifters are known conventionally. However, typical level shifters often fail to address requirements such as low design complexity, low response time, reliability, and a wide voltage range of operation.

SUMMARY

The subject matter described herein is directed towards a multiple output level shifter for integrated circuits (ICs), such as system-on-chips (SoCs), and for use in electronic devices, such as computing devices, camcorders, video games, and cellular phones. This summary is not intended to identify essential features of the claimed subject matter, nor is it intended for use in determining the scope of the claimed subject matter.

In one implementation of the invention, the multiple output level shifter includes input stage transistors, reference stage transistors, and a cascode stage to couple the input stage transistors to the reference stage transistors. The input stage transistors selectively conduct a low reference voltage as a first cascode output based on a first and a second input signal. Similarly, the reference stage transistors selectively conduct a high reference voltage as a second cascode output based on a first and a second comparator output. The multiple output level shifter further includes a pair of comparators. The comparators generate the first and the second comparator output based on the first and the second cascode output.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

FIG. 1b illustrates a truth table for the level shifter of FIG. 1a.

FIG. 2b illustrates a truth table depicting different outputs of the two-stage level shifter depicted in FIG. 2a.

FIG. 3b illustrates a truth table depicting the various outputs obtained while operating the single-stage cascoded level shifter of FIG. 3a.

FIG. 4c shows a truth table for the different outputs obtained from the multiple output level shifter of FIG. 4a and FIG. 4b.

DETAILED DESCRIPTION OF PREFERRED EMBODIMENTS

The subject matter described herein relates to a multiple output level shifter for an integrated circuit (IC). In particular, the subject matter relates to a circuit configuration of the multiple output level shifter, implemented in a single-stage cascoded configuration, for fabrication on an IC. Such a level shifter may be implemented in a variety of electronic circuits, such as flash memory circuits, electrically erasable programmable read-only memory (EEPROM) circuits, non-volatile memory (NVM) circuits, and accordingly find application in numerous electronic devices, for example, computers, laptops, digital cameras, video game consoles, and so on.

The multiple output level shifter of the present subject matter has a circuit configuration that enables high-speed operation and provides multiple outputs. In one embodiment, the circuit configuration includes transistors, such as metal-oxide semiconductor field-effect transistors (MOSFETs), that have a voltage rating lower than the voltage output of the multiple output level shifter. This helps in maintaining compactness while at the same time achieving high voltage outputs. The circuit configuration ensures that the low rating transistors operate within their safe operating areas (SOAs). For the purpose, the circuit configuration provides a cascoded positive level shifting to overcome the reliability issues generally associated with the operation of a typical level shifter at high voltages.

Figure 1A:
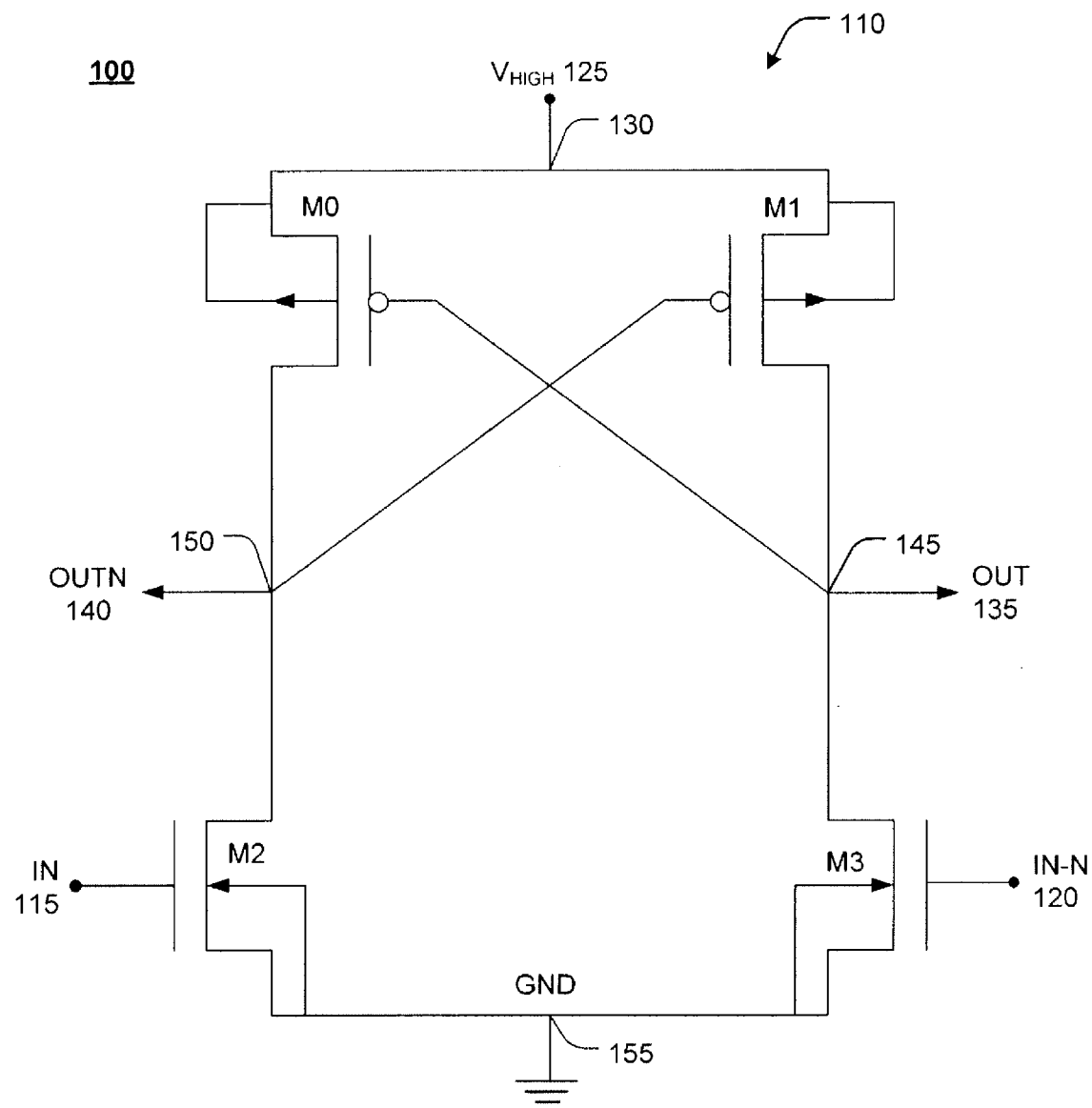
FIG. 1a illustrates a circuit configuration of a typical level shifter.

FIG. 1a illustrates a circuit configuration of a typical level shifter 100, while FIG. 1b illustrates a truth table 105 to depict the various inputs provided to the level shifter 100 and the corresponding outputs obtained therefrom. The level shifter 100 includes two p-MOSFETs M0 and M1 and two n-MOSFETs M2 and M3 connected as depicted in the circuit diagram 110. The explanation and details of well-known components are omitted for simplicity of the description.

Inputs IN 115 and IN-N 120 are logic signals, which may take a value of either '0' or '1' corresponding to a low and a high voltage. It may also be noted that the logic signals '0' and '1' are digital signals and can represent any value of voltage as per the circuit configuration. For example, '0' may correspond to 0 Volt and '1' may correspond to either 1 Volt, 1.2 Volts, 1.8 Volts or any other voltage depending on the circuit requirement. The inputs IN 115 and IN-N 120 are provided to the two n-MOSFETs M2 and M3. Specifically, the input IN 115 is applied at the gate of MOSFET M2 and simultaneously to an inverter (not shown in FIG. 1). The output of the inverter is applied at the gate of the MOSFET M3. Thus, the input IN-N 120 is an inversion of the input IN 115.

A power supply $V_{HIGH}$ 125 is connected via a power supply node 130 to the source of the p-MOSFETs M0 and M1. The voltage of the power supply $V_{HIGH}$ corresponds to a voltage level to which the inputs IN 115 or IN-N 120 may be selectively shifted to. Thus, the shifted values of the inputs IN 115 and IN-N 120 depend on the power supply $V_{HIGH}$ 125 and are obtained as outputs OUT 135 and OUTN 140 at output nodes 145 and 150, respectively. Also, at a ground node 155, the sources of MOSFETs M2 and M3 are grounded.

In operation, if input IN 115 is considered to be at logic level '1', the MOSFET M2 is put in an 'ON' state to discharge the output OUTN 140 to ground voltage, i.e., 0 Volts. On the other hand, the inverted input IN-N 120 provided to the MOSFET M3 causes the MOSFET M3 to turn non-conductive.

As evident from the circuit diagram 110, output OUTN 140 is coupled to the gate of the MOSFET M1. Accordingly, 0 Volts is received at the gate of MOSFET M1 rendering it 'ON' and enabling it to conduct the power supply $V_{HIGH}$ 125 to the output OUT 135. Thus, when input IN is at logic '1', the outputs OUT 135 and OUTN 140 are $V_{HIGH}$ 125 and 0 Volt, respectively. Similarly, when input IN 115 is at logic '0', the outputs OUT 135 and OUTN 140 are 0 Volt and $V_{HIGH}$ 125, respectively. The different values of the inputs IN 115 and IN-N 120 and their corresponding outputs are depicted in the truth table 105.

It may be noted that a gate voltage of 0 Volts is used to conduct the power supply $V_{HIGH}$ 125 through the p-MOSFETs M0 and M1. The p-MOSFETs M0 and M1 have a definite safe operating area (SOA) depending on the rating of the MOSFETs. Accordingly, the power supply $V_{HIGH}$ 125 needs to be such that the source-to-gate voltage for the p-MOSFETs M0 and M1 does not exceed the SOA limit. Also, the outputs OUT 135 and OUTN 140, respectively connected to the drain of the n-MOSFETs M3 and M4, may alternatively be $V_{HIGH}$ 125. Accordingly, the power supply $V_{HIGH}$ 125 needs to be such that it may be ensured that the drain-to-source voltage of the n-MOSFETs M2 and M3 is within the SOA. Exceeding the SOA limit may cause the oxide layers of the MOSFETs M0, M1, M2 and M3 to stress and consequently result in reliability issues in circuit.

Thus, the SOA dictates the maximum value of the power supply $V_{HIGH}$ 125. For example, if the level shifter 100 is implemented using MOSFETs whose SOA for the source-to-gate voltage is 5 Volts, the maximum power supply $V_{HIGH}$ 125 for the level shifter 100 will be restricted to 5 Volts. In such a case, the level shifter 100 may not be suitable for high voltage applications such as programming and erasing a EEPROM or a flash memory, which require about 10 to 12 Volts. One may consider implementation of the level shifter 100 using higher voltage rating MOSFETs to enable operation of the level shifter 100 at higher values of power supply $V_{HIGH}$ 125. However, the use of higher voltage rating MOSFETs significantly increases the size of the circuit. In addition, fabrication of the higher voltage rating MOSFETs requires additional processing steps as a result of which the cost of the circuit may further increase substantially. Various approaches have been followed to overcome the shortcomings of the level shifter 100. One such approach employs a two-stage level shifter, which has been discussed in detail in FIG. 2a.

Figure 2A:
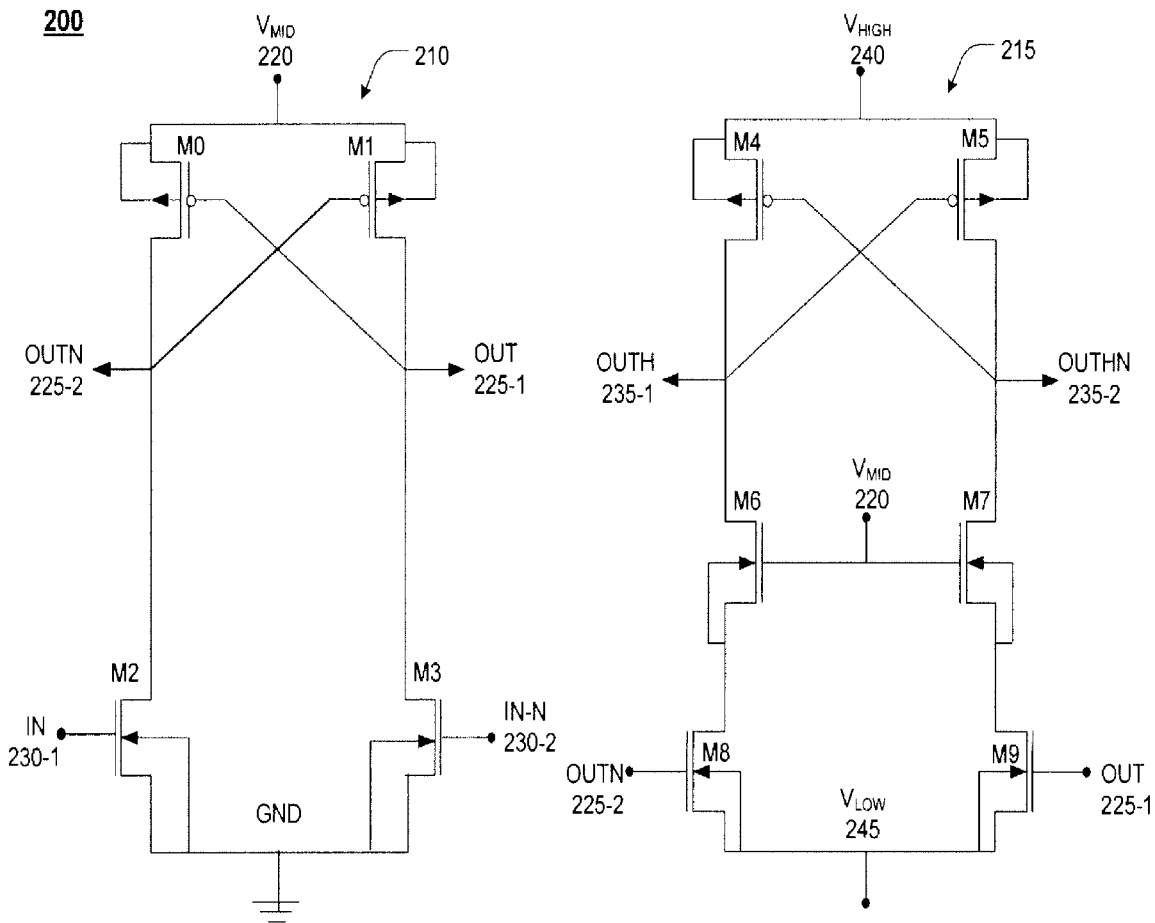
FIG. 2a shows a typical circuit configuration of a two-stage level shifter.

FIG. 2a shows a typical circuit configuration of a two-stage level shifter 200 and FIG. 2b illustrates a truth table 210 for the two-stage level shifter 200. The description of the two-stage level shifter 200 may not include the description of certain components or concepts well-known in the art for the sake of simplicity of the description.

The two-stage level shifter 200 includes a first stage circuit 210 and a second stage circuit 215 and is implemented using four p-MOSFETs M0, M1, M4, and M5 and four n-MOSFETs M2, M3, M8, and M9. Further, two n-MOSFETs M6 and M7 are used as cascoding MOSFETs in the second stage circuit 215. The circuit configuration for the interconnection of the MOSFETs is illustrated in FIG. 2a.

The operation of the first stage circuit 210 is similar to the operation of the level shifter 100 explained in FIG. 1. The power supply to the first stage circuit 210 is referred to as first stage power supply $V_{MID}$ 220. Accordingly, first stage outputs OUT 225-1 and OUTN 225-2 of the first stage circuit 210 may be 0 Volts and $V_{MID}$ 220 or $V_{MID}$ 220 and 0 Volts, alternatively, depending on first stage inputs IN 230-1 and IN-N 230-2. The first stage outputs OUT 225-1 and OUTN 225-2 are coupled to the MOSFETs of the second stage circuit 215 as gate signals to obtain final outputs OUTH 235-1 and OUTHN 235-2 in accordance with a first power supply $V_{HIGH}$ 240 and a second power supply $V_{LOW}$ 245 connected to the MOSFETs of the second stage circuit 215. As illustrated in the truth table 205 depicted in FIG. 2b, the final outputs OUTH 235-1 and OUTHN 235-2 may alternatively be $V_{HIGH}$ 240 or $V_{LOW}$ 245.

In the two-stage level shifter 200, the first stage power supply $V_{MID}$ 220 is conducted by the p-MOSFETs of the first stage circuit 210 on application of 0 Volts at their gates, while the first power supply voltage $V_{HIGH}$ 240 is conducted by the p-MOSFETs of the second stage circuit 215 when the second power supply $V_{LOW}$ 245 is applied at their gates. Therefore, the p-MOSFETs of the first and the stage circuit 210 and 215 do not experience a high source-to-gate voltage and are thus enabled to operate within their SOAs.

However, it may be noted from the truth table 205 that none of the outputs, i.e., the first stage outputs OUT 225-1 and OUTN 225-2 of the first stage circuit 210 or the final outputs OUTH 235-1 and OUTHN 235-2 of the second stage circuit 215, vary in the region between 0 Volts and the first power supply $V_{HIGH}$ 245. Thus, the two-stage level shifter 200 may fail to provide a large voltage variation range, which is often desirable in many applications. Also, the two-stage level shifter 200 uses three different power supplies, namely the first power supply $V_{HIGH}$ 245, a second power supply $V_{LOW}$ 250, and the first stage power supply $V_{MID}$ 220. As a result, the circuit complexity increases and compactness suffers. Furthermore, all the different power supplies, i.e., the first power supply $V_{HIGH}$ 245, the second power supply $V_{LOW}$ 250 and first stage power supply $V_{MID}$ 220 have to be chosen taking in consideration the SOAs of all the MOSFETs employed in the first stage circuit 210 and the second stage circuit 215 to ensure that none of the MOSFETs operate outside their SOAs. These stringent supply requirements impose an undue restriction on the design implementation of an electronic circuit employing the two-stage level shifter 200. It may also be added that since the two-stage level shifter 200 operates in two stages, its response time is high as compared to single-stage level shifters. This makes the two-stage level shifter 200 unsuitable for use in applications requiring a compact circuitry or high speed performance. To overcome the shortcomings of two-stage level shifters, some applications make use of single-stage cascoded level shifters.

Figure 3A:
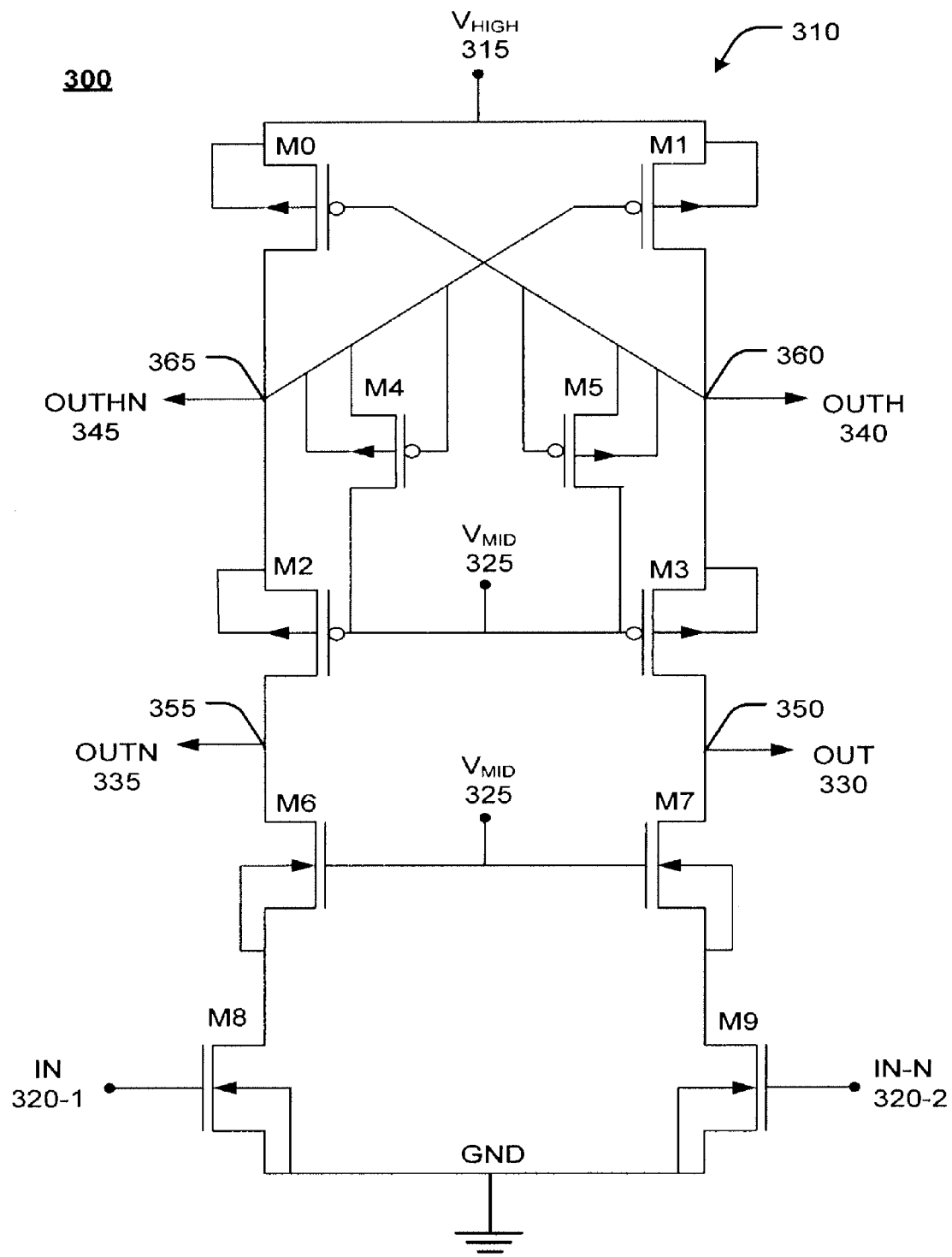
FIG. 3a illustrates a typical circuit configuration of a single-stage cascoded level shifter.

FIG. 3a illustrates a typical circuit configuration of a single-stage cascoded level shifter 300. FIG. 3b illustrates a truth table 305 depicting the outputs obtained from the single-stage cascoded level shifter 300. Certain aspects of the single-stage cascoded level shifter 300 that are well-known in the prior art may have been omitted from the description of FIG. 3a to maintain simplicity of the description.

The circuit configuration of the single-stage cascoded level shifter 300 is represented using a circuit diagram 310. The single-stage cascoded level shifter 300 engages six p-MOSFETs M0 through M5 and four n-MOSFETs M6 through M9. The connection between the various MOSFETs is depicted in the circuit diagram 310.

The MOSFETs M2, M3, M6, and M7 are coupled together to form a cascode stage. A power supply $V_{HIGH}$ 315 is provided to the single-stage cascoded level shifter 300. A pair of inputs IN 320-1 and IN-N 320-2, corresponding to logic '0' or '1', are applied as gating signals to MOSFETs M8 and M9, while a cascode voltage $V_{MID}$ 325 is applied to the MOSFETs M2, M3, M6, and M7 of the cascode stage. Four outputs namely, OUT 330, OUTN 335, OUTH 340, and OUTHN 345 are obtained from the single-stage cascoded level shifter 300. The outputs OUT 330 and OUTN 335 are obtained from a first and a second output node 350 and 355, respectively, while the outputs OUTH 340 and OUTHN 345 are obtained from a third and a fourth output node 360 and 365, respectively.

The values of the outputs OUT 330, OUTN 335, OUTH 340, and OUTHN 345 corresponding to the various values of the inputs IN 320-1 and IN-N 320-2 are depicted in the truth table 305. As shown in the truth table 305, the outputs OUTH 340 and OUTHN 345 vary between $V_{HIGH}$ 315 and ($V_{MID}$+$V_{TP}$), where $V_{TP}$ is the threshold voltage of the MOSFETs M2 and M3. It may be noted that the OUTH 340 and OUTHN 345, which are derived from the third and the fourth output nodes 360 and 365, respectively, are coupled only to p-MOSFETs and thus, are unstable.

The MOSFET M5 is placed in a diode connection between the third output node 360 and the gate of the MOSFET M3. Similarly, the MOSFET M4 is connected to the fourth output node 365 and the gate of the MOSFET M2. To appreciate the function of the MOSFETs M4 and M5, one may consider application of input signal of logic level 1 at input IN 320-1, due to which output OUTN 335 is at ground or 0 volts, OUT 330 is at $V_{HIGH}$ 315, OUTH 340 is at $V_{HIGH}$ 315 and OUTHN 345 is at ($V_{MID}$+$V_{TP}$). As MOSFET M1 is in 'ON' state and conducting $V_{HIGH}$ 315 to OUTH 340 at the third output node 360, it is possible that a part of the charge leaks to the fourth output node 365. This can cause the output OUTHN 345 to increase. The moment output OUTHN 345 becomes greater than ($V_{MID}$+$V_{TP}$), the MOSFET M2, receiving the cascode voltage $V_{MID}$ 325 at it gate, switches ON and discharges the output OUTHN 345 to ground through output OUTN 335. The output OUTHN 345, due to the coupling of the fourth output node 365 with the p-MOSFET M2 decrease quickly during discharging. As soon as the output OUTHN 345 attains a value less than ($V_{MID}$-$V_{TP}$), the MOSFET M4 receiving the cascode voltage $V_{MID}$ 325 at its drain turns ON and restricts the output OUTHN 345 by conducting the cascode voltage $V_{MID}$ 325 to the fourth output node 365. Due to this, a minimum value of the output OUTHN 345 is limited to ($V_{MID}$-$V_{TP}$). Hence, a minimum voltage limit for the output OUTHN 345 is ($V_{MID}$-$V_{TP}$), while a maximum voltage limit for the output OUTHN 345 is ($V_{MID}$+$V_{TP}$), where $V_{TP}$ is the threshold voltage of MOSFET M2 and MOSFET M4. The MOSFET M5 would function in a similar manner to M4, limiting the output OUTH 340 between ($V_{MID}$-$V_{TP}$) and ($V_{MID}$+$V_{TP}$).

As apparent from the above explanation, the outputs OUTH 340 and OUTHN 345 may attain a value between ($V_{MID}$+$V_{TP}$) and ($V_{MID}$-$V_{TP}$) and are not stable. Further, as commonly known, the threshold voltage of a MOSFET often varies with conditions such as temperature change. The instability of the outputs OUTH 340 and OUTHN 345 as well as their dependence on the threshold voltage of the MOSFETs used is undesirable in applications that requires a stable voltage range.

In addition to the above mentioned limitations, the single-stage cascoded level shifter 300 is slow in performance, specifically in cases where the outputs OUTH 340 and OUTHN 345 are required to drive a load, for example, a capacitive load.

Figure 4A:
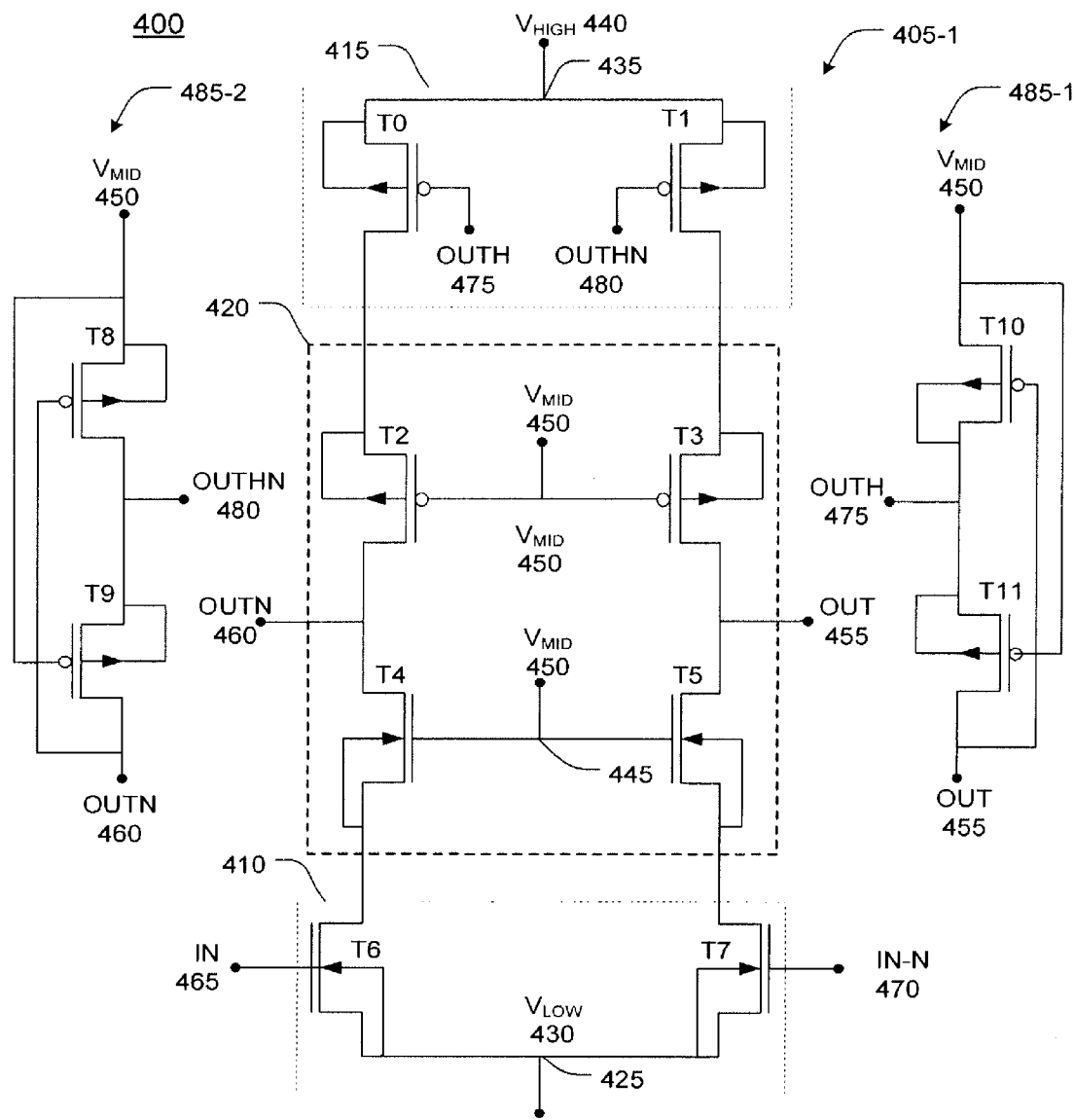
FIG. 4a illustrates a circuit configuration of a multiple output level shifter in accordance with an embodiment of the present subject matter.

FIG. 4a illustrates a circuit configuration of a multiple output level shifter 400, implemented in a single-stage cascoded configuration, in accordance with an embodiment of the present subject matter. A circuit diagram 405-1 depicts the circuit configuration of the multiple output level shifter 400. For the sake of readability the multiple output level shifter 400 is hereinafter referred to as level shifter 400.

The level shifter 400 includes input stage transistors 410, reference stage transistors 415, and a cascode stage 420 to couple the input stage transistors 410 and the reference stage transistors 415. The input stage transistors 410 are also coupled to a first voltage terminal 425 to receive a low reference voltage, such as reference voltage $V_{LOW}$ 430. Similarly, the reference stage transistors 415 are coupled to a second voltage terminal 435 to receive a high reference voltage, such as reference voltage $V_{HIGH}$ 440. The reference voltage $V_{HIGH}$ 440 corresponds to a voltage level to which an input of the level shifter 400 is required to be shifted. The cascode stage 420 is coupled to a third voltage terminal 445 to receive a cascode voltage $V_{MID}$ 450. The cascode voltage $V_{MID}$ 450 has a value between the reference voltage $V_{LOW}$ 430 and the reference voltage $V_{HIGH}$ 440.

The inputs to the level shifter 400, namely a first input and a second input, are provided to the input stage transistors 410. The first and the second inputs correspond to a low logic voltage signal and a high logic voltage signal. A first cascode output and a second cascode output are obtained from the cascode stage 420. Depending upon the first and the second inputs, one between the first and the second cascode outputs is discharged to the reference voltage $V_{LOW}$ 430 by the input stage transistors 410. The other output is the reference voltage $V_{HIGH}$ 440 depending upon a first comparator output and a second comparator output received by the reference stage transistors 415 from a pair of comparators.

For the ease of description, the first and the second cascode outputs are referred to as cascode outputs OUT 455 and OUTN 460, respectively; the first and the second inputs are referred to as inputs IN 465 and IN-N 470, respectively; and the first and the second comparator outputs are referred to as final output OUTH 475 and OUTHN 480, respectively, in accordance with one embodiment of the invention. Further, the first and the second comparator outputs, obtained from the pair of comparators namely a first comparator 485-1 and a second comparator 485-2, are referred to as the final output OUTH 475 and OUTHN 480, respectively.

Figure 4B:
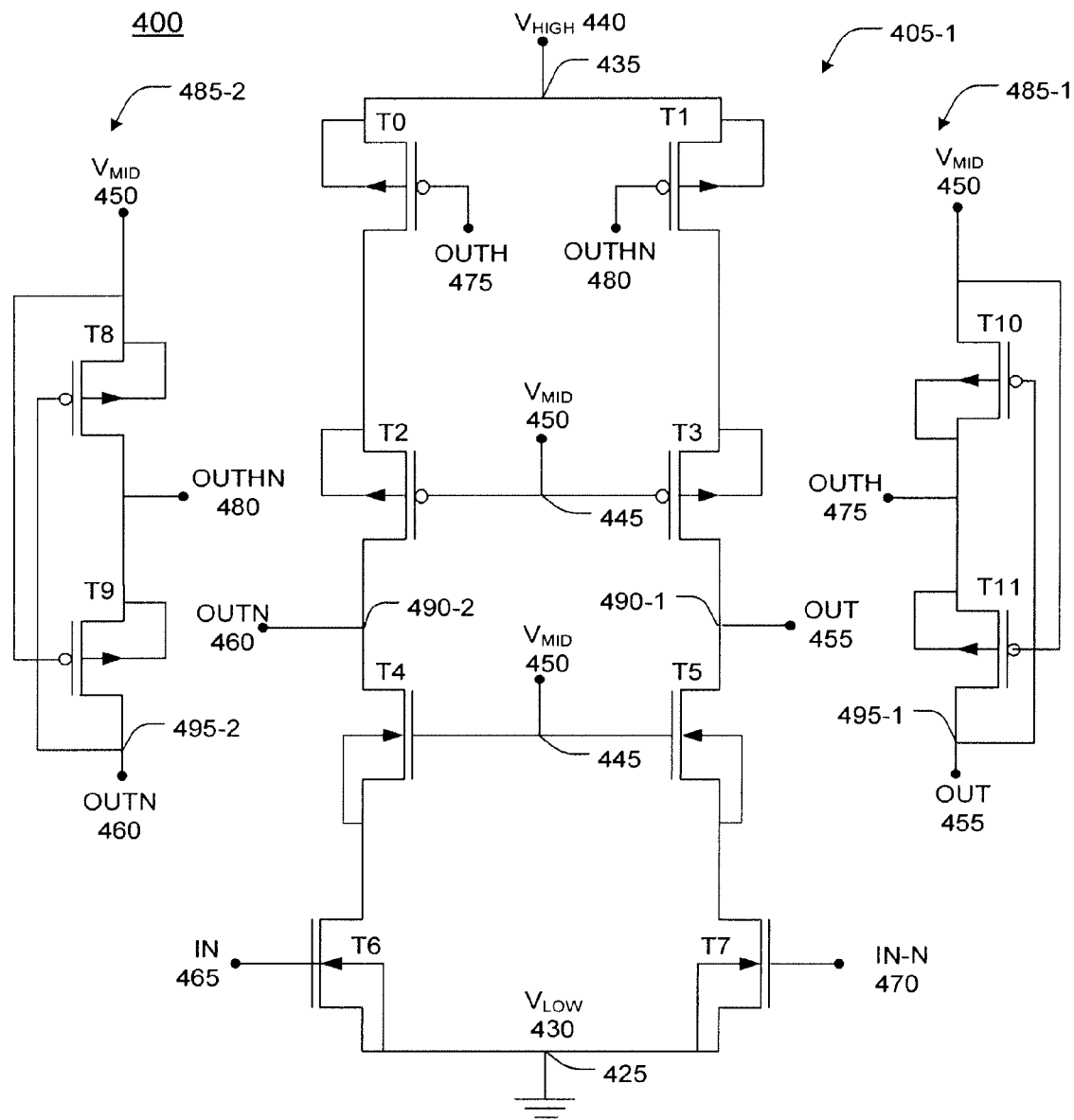
FIG. 4b illustrates another circuit configuration of the multiple output level shifter in accordance with an embodiment of the present subject matter.

The operation of the level shifter 400 is elaborated with regard to the circuit diagram 405-1, depicted in FIG. 4b, and a truth table 405-2, depicted in FIG. 4c.

The circuit configuration of the level shifter 400, illustrated in the circuit diagram 405-1, depicts p-MOSFETs and n-MOSFETs used as transistors. Although the transistors are explained herein as p-MOSFETs and n-MOSFETs, a person of ordinary skill in the art will appreciate that other devices, such as complementary devices, performing similar functions are also possible in accordance with the present invention. It will be also appreciated by those skilled in the art that the words during, while, and the like, used herein are not exact terms that mean an action takes place instantly upon initiating an action, but that there may be some small but reasonable delay, such as a propagation delay, between the reaction initiated by the initial action. Additionally, descriptions and details of well-known components are omitted for simplicity of the description.

FIG. 4b illustrates the circuit configuration of the level shifter 400 in accordance with an embodiment of the present subject matter. The circuit configuration of the enables fabrication of the level shifter 400 on an IC to enhance compactness and high speed performance of the IC. To elucidate the working of the level shifter 400, reference has been made to the specific components, namely the input stage transistors 410, the reference stage transistors 415 and the cascode stage 420.

As aforementioned, the input IN 465 and the input IN-N 470 are provided to the input stage transistors 410. Specifically, the inputs IN 465 and IN-N 470 are applied at the gates of a pair of input transistors, such n-MOSFETs. The input IN 465 is provided to a MOSFET T6 while the input IN-N 470 is provided to a MOSFET T7. It may be mentioned that the input IN-N 470 is the inverse of the input IN 465, and accordingly the input IN 465 may be applied to an inverter (not shown in this figure) to obtain the input IN-N 470.

Further, the sources of the MOSFETs T6 and T7 are connected to the first voltage terminal 425 to receive the reference voltage $V_{LOW}$ 430. In one implementation, the reference voltage $V_{LOW}$ 430 may be at the ground potential, i.e., 0 Volts. The drains of the MOSFETs T6 and T7 are coupled to the sources of a pair of n-MOSFETs T4 and T5, respectively. The MOSFETs T4 and T5 are cascode transistors that serve as a first level of the cascode stage 420. The drains of the MOSFETs T4 and T5 of the first level are coupled to the drains of another pair of cascode transistors, i.e., p-MOSFETs T2 and T3, that form a second level of the cascode stage 420. The gates of the MOSFETs T4, T5, T2 and T3 are provided with the cascode voltage $V_{MID}$ 450.

The two junctions terminals where the drains of the MOSFETs of the first level and the second level are connected serve as output terminals. Accordingly, a first output terminal 490-1 may be used to obtain the cascode output OUT 455 and a second output terminal 490-2 may be used to draw out the cascode output OUTN 460. The cascode output OUT 455 is provided as an input to the first comparator 485-1. Likewise, the cascode output OUTN 460 is coupled to the second comparator 485-2.

In one embodiment, both the first and the second comparators 485-1 and 485-2 include a pair of p-MOSFETs. Specifically, the first comparator 485-1 includes MOSFETs T10 and T11 coupled to each other, while and the second comparator 485-2 includes MOSFETs T8 and T9 coupled to each other. In the present embodiment, a specific implementation of the first and the second comparators 485-1 and 485-2 is described. However, it will be appreciated by a person ordinarily skilled in the art that the first and the second comparators 485-1 and 485-2 may be realized in other ways known in the art without deviating from the scope of the invention.

To provide the cascode output OUT 455 to the first comparator 485-1, the first output terminal 490-1 is connected to a first comparator terminal 495-1 of the first comparator 485-1. On the other hand, the cascode output OUTN 460 is coupled to the second comparator 485-2 through a second comparator terminal 495-2. It will be appreciated that for the purposes of simplicity, the respective connections between the first and the second output terminals 490-1 and 490-2 and the first and the second comparator terminal 495-1 and 495-2 have not been shown in FIG. 4b.

In operation, the MOSFET T11 of the first comparator 485-1 receives the cascode output OUT 455 at its drain and the cascode voltage $V_{MID}$ 450 at its gate. On the other hand, the MOSFET T10 receives the cascode output OUT 455 at its gate and the cascode voltage $V_{MID}$ 450 at its drain. The output of the first comparator 485-1, like an output of a typical comparator known in the art, is either the cascode output OUT 455 or the cascode voltage $V_{MID}$ 450 depending upon which one of them has a higher voltage level. The output of the first comparator 485-1, as explained above, is the final output OUTH 475. Similarly, the cascode output OUTN 460 is fed to the second comparator 485-2 to obtain the final output OUTHN 480.

The outputs OUTH 475 and OUTHN 480 are provided as gate signals to a pair of reference transistors, specifically to a pair of p-MOSFETs T0 and M1, respectively. Further, the drains of the MOSFETs T0 and T1 are connected to the sources of the MOSFETs T2 and T3, respectively. Additionally, the sources of the MOSFETs T0 and T1 are connected to the second voltage terminal 435 to receive the reference voltage $V_{HIGH}$ 440.

In order to elucidate the working of the level shifter 400, the input IN 465 may be considered to be the low logic voltage signal and accordingly the input IN-N 470 may be the high logic voltage signal. For example, the input IN 465 may correspond to 0 Volts while the input IN-N 470 may correspond to one of 3.3, 5, 7.5 or 10 Volts. When the input IN 465, i.e., 0 Volt is applied, the MOSFET T6 turns 'OFF' while the input IN-N 470 at logic '1' turns 'ON' the MOSFET T7. As a result, the MOSFET T7 conducts the reference voltage $V_{LOW}$ 430, applied at the source of the MOSFET T7, as the cascode output OUT 455. For example, if the reference voltage $V_{LOW}$ 430 is chosen to be 0 Volts, the cascode output OUT 455 is discharged to 0 Volts.

The cascode output OUT 455 is provided as an input to the first comparator 485-1. Upon comparison of the cascode output OUT 455 at 0 Volt with the cascode voltage $V_{MID}$ 450, which is chosen to be higher than the reference voltage $V_{LOW}$ 430, the final output OUTH 475 attains a voltage same as the cascode voltage $V_{MID}$ 450.

Thereupon, the final output OUTH 475 is applied at the gate of the MOSFET T0, as earlier explained. In effect, the MOSFET T0 receives $V_{MID}$ 450 as the final output OUTH 475 at its gate and the reference voltage $V_{HIGH}$ 440 at its source. As a result, MOSFET T0 conducts the reference voltage $V_{HIGH}$ 440 as the cascode output OUTN 460 through the MOSFET T2.

The cascode output OUTN 460 having the reference voltage $V_{HIGH}$ 440 serves as an input to the second comparator 485-2. In the second comparator 485-2, the cascode output OUTN 460 is compared to the cascode voltage $V_{MID}$ 450. The result of the comparison is the signal that possesses a higher voltage and is provided as a gating signal to MOSFET T1. As is apparent in the present example, the final output OUTHN 480 of the second comparator 485-2 is equal to the reference voltage $V_{HIGH}$ 440 and when applied as the gate signal, causes the MOSFET T1 to be non-conductive.

Based on the foregoing explanation, it may be summarized that when the input IN 465 is at logic '0' and IN-N 470 is at logic '1', the cascode outputs OUT 455 and OUTN 460 and the final outputs OUTH 475 and OUTHN 480 are: 0 Volts; reference voltage $V_{HIGH}$ 440; cascode voltage $V_{MID}$ 450; and reference voltage $V_{HIGH}$ 440, respectively. On similar lines, it may be stated that when the input IN 465 is at logic '1' and IN-N 470 is at logic '0', cascode outputs OUT 455 and OUTN 460 and the final outputs OUTH 475 and OUTHN 480 are: reference voltage $V_{HIGH}$ 440; 0 Volts; reference voltage $V_{HIGH}$ 440; and cascode voltage $V_{MID}$ 450, respectively. The truth table 405-2 illustrated in FIG. 4c shows the various outputs corresponding to the two logic levels '0' and '1' of the input IN 465 in a tabular form.

The final outputs OUTH 475 and OUTHN 480 are determined by high speed comparators 485-1 and 485-2. This enables the level shifter 400 to swiftly attain a change of state between the various output voltages. Hence, the speed of operation of the level shifter 400 is enhanced. Also, the first and the second comparators 485-1 and 485-2 may be realized using a compact circuitry. In accordance with the explanation of the working of the level shifter 400, it is apparent that the level shifter 400 provides multiple outputs. It may be mentioned that the OUT 455 and OUTN 460 advantageously have a wide voltage swing since they vary between 0 Volts and the reference voltage $V_{HIGH}$ 440. Further, the final outputs OUTH 475 and OUTHN 480 alternate between the reference voltage $V_{HIGH}$ 440 and the cascode voltage $V_{MID}$ 450. Furthermore, the level shifter 400 provides for single stage cascoded positive level shifting to ensure compactness, low response time, and reliability of operation.

It may also be mentioned that reliability of the level shifter 400 is ensured by maintaining all the MOSFETs of the level shifter 400 within the SOA. This may be explained by the fact that the cascode voltage $V_{MID}$ 450 is used to pass the reference voltage $V_{HIGH}$ 440 through the p-MOSFETs T0 and T1. Thus, the source to drain voltage of the p-MOSFETs T0 and T1 is restricted within the SOA. Further, the level shifter 400 uses only three power sources to supply the input IN 465, the cascode voltage $V_{MID}$ 450, and the reference voltage $V_{HIGH}$ 440 to enhance compactness of the IC.

Thus, though the level shifter 400 is implemented using small sized transistors having low voltage rating to maintain compactness, the level shifter 400 can provide high voltage outputs. Accordingly, the level shifter 400 can be employed in high voltage applications and applications where a large range of voltage variation is desired. For example, the level shifter 400 may be used in flash memory circuits, EEPROM circuits, other NVM circuits, phase-locked loops (PLL) and so on.

Although embodiments for the multiple output level shifter have been described in language specific to structural features and/or methods, it is to be understood that the invention is not necessarily limited to the specific features or methods described. Rather, the specific features and methods are disclosed as exemplary implementations for the multiple output level shifter.

I claim:

1. A level shifter comprising:
   input stage transistors to selectively conduct a low reference voltage as a first cascode output based on a first and a second input signal;
   reference stage transistors to selectively conduct a high reference voltage as a second cascode output based on a first and a second comparator output, the reference stage having a differential input and a separate differential output;
   a cascode stage coupled to the input stage transistors and the reference stage transistors, wherein the first and the second cascode output are obtained from the cascode stage; and
   a pair of comparators to generate the first and the second comparator output based on the first and the second cascode output.

2. The level shifter as claimed in claim 1, wherein the cascade stage further comprises:
   a first level of cascode transistors coupled to the input stage transistors; and
   a second level of cascode transistors coupled to the first level of cascode transistors and to the reference stage transistors,
   wherein the first and the second level of cascode transistors are gated by a cascode voltage.

3. The level shifter as claimed in claim 2, wherein the first level and the second level of cascode transistors comprise a pair of n-type and p-type transistors respectively.

4. The level shifter as claimed in claim 1, wherein each of the pair of comparators is configured to compare one of the first and the second cascode output to a cascode voltage to generate one of the first and the second comparator output.

5. The level shifter as claimed in claim 1, wherein the first and the second comparator output are applied at gates of the reference stage transistors.

6. The level shifter as claimed in claim 1, wherein the reference stage transistors comprise a pair of p-type transistors that receive the high reference voltage at sources of the pair of p-type transistors.

7. The level shifter as claimed in claim 1, wherein the input stage transistors comprise a pair of n-type transistors that receive the low reference voltage at sources of the pair of n-type transistors.

8. The level shifter as claimed in claim 1, wherein the first cascode output is at the low reference voltage when the second cascode output is at the high reference voltage.

9. The level shifter as claimed in claim 1, wherein the first comparator output is at a cascade voltage when the second comparator output is at the high reference voltage.

10. The level shifter as claimed in claim 1, wherein the first and second input signal correspond to a low logic voltage signal and a high logic voltage signal respectively.

11. An integrated circuit comprising:
    a plurality of cascode transistors coupled to function as a cascode stage;
    a pair of input transistors coupled to the cascode stage to present a low reference voltage at a first output of the cascode stage;
    a pair of reference transistors having current nodes coupled to the cascode stage to present a high reference voltage at a second output of the cascode stage; and
    a first and a second comparator to generate a first and a second comparator output based on the first and the second cascode output respectively,
    wherein the first and second comparator outputs gate voltage nodes of the pair of references transistors separate from the current nodes.

12. The integrated circuit as claimed in claim 11, wherein a first and a second input signal gate the pair of input transistors, the second input signal being an inverse of the first input signal.

13. The integrated circuit as claimed in claim 12, wherein the first and the second input signal correspond to a high logic voltage signal and a low logic voltage signal, respectively.

14. The integrated circuit as claimed in claim 12, further comprising an inverter to invert the first input signal to generate the second input signal.

15. The integrated circuit as claimed in claim 11, wherein the cascode stage further comprises:
- a pair of n-type cascode transistors coupled to the pair of input transistors; and
- a pair of p-type cascode transistors coupled to the pair of reference transistors, wherein the pair of n-type cascode transistors are coupled to the pair of p-type cascode transistors.

16. The integrated circuit as claimed in claim 11, wherein the cascode transistors are gated by a cascode voltage, the cascode voltage being greater than the low reference voltage and less than the high reference voltage.

17. The integrated circuit as claimed in claim 16, wherein the first and the second comparators compare the first and the second cascode outputs to the cascode voltage.

18. The integrated circuit as claimed in claim 11, wherein each of the first and the second comparator comprises a pair of p-type transistors.

19. An integrated circuit as claimed in claim 11, wherein the pair of input transistors are n-type transistors and wherein the pair of reference transistors are p-type transistors.

20. A level shifter comprising:
- an input stage having a low power supply terminal, a differential input, and a differential output;
- a reference stage having a high power supply terminal, a differential input, and a differential output separate from the differential input;
- a cascode stage having a middle power supply terminal, a first differential input coupled to the differential output of the input stage, a second differential input coupled to the differential output of the reference stage, and a differential output; and
- a comparator pair coupled between the middle power supply terminal and the differential output of the cascode stage, and having a differential output coupled to the differential input of the reference stage.

* * * * *